United States Patent
Schmauss

(10) Patent No.: US 9,739,823 B2
(45) Date of Patent: Aug. 22, 2017

(54) DIAGNOSTIC CIRCUIT AND METHOD FOR THE OPERATION OF A DIAGNOSTIC CIRCUIT

(71) Applicant: CONTINENTAL AUTOMOTOVE GMBH, Hannover (DE)

(72) Inventor: Harald Schmauss, Donaustauf (DE)

(73) Assignee: Continental Automotive GmbH, Hannover (DE)

( * ) Notice: Subject to any disclaimer, the term of this patent is extended or adjusted under 35 U.S.C. 154(b) by 21 days.

(21) Appl. No.: 14/862,371

(22) Filed: Sep. 23, 2015

(65) Prior Publication Data

US 2016/0084899 A1 Mar. 24, 2016

(30) Foreign Application Priority Data

Sep. 23, 2014 (DE) ........................ 10 2014 219 130

(51) Int. Cl.
*G01R 31/02* (2006.01)
*G01R 31/00* (2006.01)

(52) U.S. Cl.
CPC .......... *G01R 31/026* (2013.01); *G01R 31/006* (2013.01)

(58) Field of Classification Search
CPC combination set(s) only.
See application file for complete search history.

(56) References Cited

U.S. PATENT DOCUMENTS 6,456,156 B1 9/2002 Frey et al.
7,667,940 B2 2/2010 Turpin et al.

FOREIGN PATENT DOCUMENTS

DE 19920465 C1 11/2000

*Primary Examiner* — Clayton E Laballe
*Assistant Examiner* — Jas Sanghera
(74) *Attorney, Agent, or Firm* — Laurence A. Greenberg; Werner H. Stemer; Ralph E. Locher

(57) ABSTRACT

A diagnostic circuit detects an interruption in a connection between a circuit arrangement having at least one first controllable switching element, which forms a load path between a first and a second load terminal, and a load connectable thereto. The load is connectable by the switching element to a supply voltage source with a first terminal for a high supply potential and a second terminal for a lower supply potential. At least one further controllable switching element forms a load path between a first and a second load terminal, the load path of which is connected in parallel to the load path of the first switching element. A control unit controls the control inputs of the first and of the further switching element, whereby the control unit is configured for the control of the first and of the further switching element in accordance with a time-adjustable operating sequence.

8 Claims, 2 Drawing Sheets

DIAGNOSTIC CIRCUIT AND METHOD FOR THE OPERATION OF A DIAGNOSTIC CIRCUIT

CROSS-REFERENCE TO RELATED APPLICATION

This application claims the priority, under 35 U.S.C. §119, of German application DE 10 2014 219 130.0, filed Sep. 23, 2014; the prior application is herewith incorporated by reference in its entirety.

BACKGROUND OF THE INVENTION

Field of the Invention

In motor vehicles, a multitude of electricity consuming devices are turned on and off manually by vehicle occupants or by the action of control programs running on control devices. These devices may include, for example, vehicle lights or windscreen wipers, but also fuel injection valves or ignition coils. Depending upon the consuming device concerned, switches are used which connect consuming devices to the ground potential of a voltage supply source, specifically the motor vehicle battery, or to the high-side potential of the voltage supply source. As an alternative to the use of only one low-side or high-side switch for this purpose, both may be connected simultaneously, where applicable in a full bridge. Push-pull output stages are also possible, in order to permit, for example, the charging and rapid discharging of capacitive consuming devices. Integrated MOSFETs are generally used as switching elements.

It is frequently necessary to detect an interruption in the connecting line between a load and the switching element which connects this load to the supply voltage. A line interruption is generally detected by the measurement, with the switching element closed, of the current flowing in the switching element and in the connected load. Where no current or only a very small current is flowing, it is concluded that a line interruption is present. Current measurement is effected either by a special shunt or by the load path resistance of the switching element, whereby the voltage drop in the respective shunt considered is determined and is compared with a predetermined reference voltage. The main problem associated with the detection of a line interruption is that the absence of a current flowing in the load or the presence of only a very small current must be detected, whereby this very small current, which is defined as the fault current, must be smaller than the minimum current on the connected load. However, in response to substantial fluctuations of the supply voltage in the motor vehicle, and not insignificant load resistance tolerances, this current may also be subject to substantial fluctuations.

Accordingly, the maximum current defined as the fault current must not be very large, with the consequence, however, that the voltage drop generated by the latter in a shunt will not be very large, whereby the compensation of the small current by a correspondingly large resistance is not possible on the grounds that, in normal service, this large resistance would generate a substantial power loss. Moreover, in case of the direct recording of the current, a highly accurate reference voltage is needed for comparative purposes, thereby requiring correspondingly complex circuitry.

SUMMARY OF THE INVENTION

It is therefore the object of the present invention to propose a circuit for the diagnosis of a line interruption and a method for the operation of such a diagnostic circuit which are both straightforward and deliver sufficient accuracy.

In a circuit topology described in the introduction, in which at least one first controllable switching element connects a load to a supply voltage source by means of a first terminal for a high supply potential and a second terminal for a lower supply potential, whereby the first controllable switching element may be both a high-side and a low-side switching element, according to the invention, at least one further controllable switching element and its associated load path are arranged in parallel to the load path of the first switching element. The diagnostic circuit for the detection of an interruption in the connection between the at least first controllable switching element and the load is also provided with a control unit for the control of the control inputs of the first and of the at least one further switching element, whereby the control unit is configured for the control of the first and of the at least one further switching element in accordance with a time-adjustable operating sequence. The diagnostic circuit is also provided with an analysis unit with a first and a second input and an output, whereby the first input is connected, via a reference voltage source, to the terminal of the supply voltage source to which the first switching element is connected, and the second input is connected to the terminals of the first and of the at least one further switching elements which are connectable to the load. The analysis unit is configured to indicate, at its output, whether the voltage in the load paths of the first and/or of the at least one further switching elements is higher or lower than the reference voltage.

The diagnostic circuit according to the invention can be operated by a method according to the invention whereby, in normal operation, both the first controllable switching element and the further switching element(s) are controlled to close by the control unit such that their parallel-connected load path resistances generate a very small total resistance, which results in only minor power losses in case of an intact connection to the load. In case of an interruption in the connection between the switching elements and the load, the voltage drop in the total load path resistance associated with a very small current, which would still be interpreted as an interruption, will not actuate the analysis circuit, as the reference voltage selected is higher.

According to the invention, however, in case of the presence of only one further switching element, one of the switching elements is opened for a specific time interval such that, during this time interval, a higher load path resistance occurs and, in consequence, the voltage drop associated with a small fault current is higher and, where applicable, the analysis unit would indicate the fault accordingly.

The switching elements may have equal load path resistances such that, upon the disconnection of one switching element, the value of the load path resistance is doubled, but may also have different load path resistances, such that a correspondingly higher load path resistance is also available for diagnostic purposes.

Rather than operation with both switching elements closed in normal duty, it is also possible, in case of the use of switching elements with different load path resistances, to select one with a very low load path resistance and the other with a correspondingly higher load path resistance whereby, in normal operation, only the switching element with the lower load path resistance is closed, and a switchover to that with the higher load path resistance is executed for diagnostic purposes.

In case of the use of a number of parallel-connected switching elements, which may have equal or different load path resistances, it is possible, by the closing and opening of one or of combinations of these switching elements, to set a desired total load path resistance or total load path resistance characteristic. This is advantageous where the load path resistances of the switching elements change in response to a temperature variation such that, by the corresponding selection of the switching elements which are to be closed for diagnostic purposes, a corresponding selection will be available.

It is therefore possible, at lower temperatures, to offset the reduced resistance of the switching elements which are closed in normal operation by switching elements of higher resistance rating. Conversely, in case of a temperature increase in the switching elements, and a consequent increase in resistance, this offsetting can be achieved by the selection of a switching element or group of switching elements of correspondingly lower resistance rating for diagnostic purposes.

In this way, it is also possible to achieve an adaptation to different load resistances by the corresponding selection of switching elements which are closed for diagnostic purposes.

In the case of specific loads, for example ignition coils, the voltage drop in the switching elements must not exceed a specific maximum value such that, according to the invention, the control unit for the control of the switching elements is configured with a configurable facility such that, depending upon the actual load connected, an appropriate selection of switching elements can be achieved, whereby information on the load can be entered in a register of the control unit which is accessible via an interface.

Other features which are considered as characteristic for the invention are set forth in the appended claims.

Although the invention is illustrated and described herein as embodied in a diagnostic circuit and a method for the operation of a diagnostic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
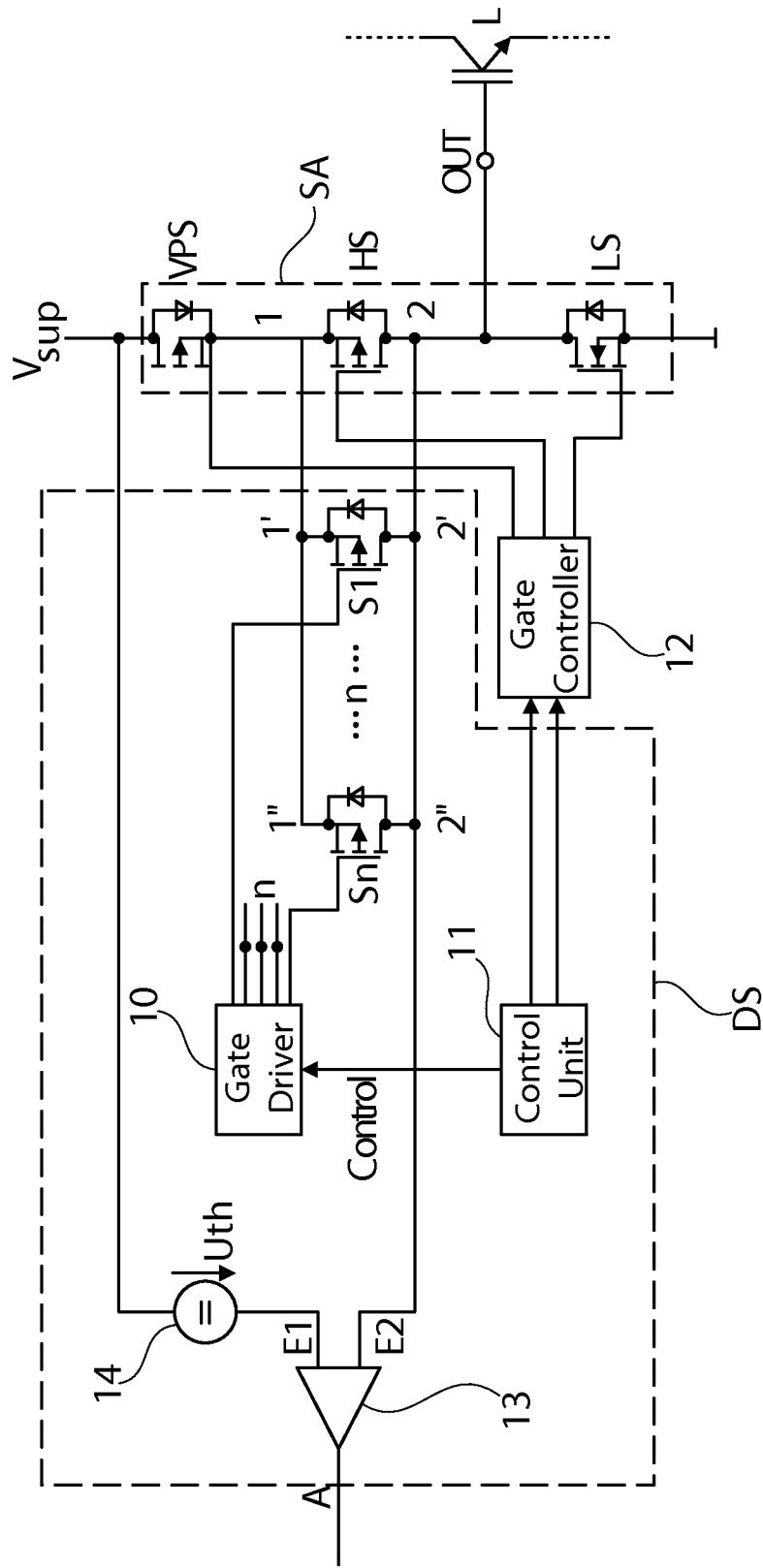
FIG. 1 is a schematic diagram showing an example of embodiment of a diagnostic circuit according to the invention.

Referring now to the figures of the drawings in detail and first, particularly to FIG. 1 thereof, there is shown a circuit arrangement SA which is formed of a first switching element HS, configured as a high-side switch, a second switching element LS, configured as a low-side switch, and a third switching element VPS, configured as a polarity reversal protection element. The circuit arrangement SA is connected between the high and lower potential of a supply voltage Vsup. The switching elements HS, LS and VPS are configured as MOSFETS with substrate diodes, whereby the first switching element HS is configured as a p-channel MOSFET and the second switching element LS is configured as an n-channel MOSFET.

Given the incorporation of substrate diodes, in the event of a polarity reversal—i.e. the connection of the circuit arrangement SA to the incorrect potentials of the supply voltage Vsup—a quasi-short-circuit current would flow in the substrate diodes. In order to prevent this, the third switching element VPS, also configured as a p-channel MOSFET, is arranged between the high potential of the supply voltage Vsup and the source terminal of the first switching element HS, but in the reverse polarity to the first switching element HS. The three switching elements HS, LS and VPS are arranged in series, whereby the connection point of the first switching element HS to the second switching element LS serves as the output terminal OUT to which, in the schematically-represented example of embodiment, the control terminal of an insulated gate bipolar transistor (IGBT), which serves as a load L, is connected.

The circuit arrangement SA for a diagnostic circuit according to the invention may also incorporate only one switching element, which is configured as either a high-side or a low-side switch, depending upon the potential of the supply voltage Vsup to which a switchable load is to be connected. Between a high-side and a low-side switching element, two output terminals may also be provided, to which the two terminals of a load may be connected, in order to operate the load in a half-bridge circuit.

In the example of embodiment represented, the IGBT serving as the load L, in normal duty, is connected to the high potential of the supply voltage Vsup via the first switching element HS, such that the IGBT is set to a conductive state. Once the latter has been disconnected, the second switching element LS is closed, in order to permit the further discharge of the gate capacitance of the IGBT.

The first switching element HS is provided with a first load path terminal 1 and a second load path terminal 2 which, in the example represented, are the source and drain terminals of the p-channel MOSFET respectively.

The three switching elements VPS, HS and LS in the circuit arrangement SA, with their associated control or gate terminals, are connected to a gate control circuit 12 which, in accordance with the control signals generated, for example, by a microprocessor unit—not represented here—controls the gate terminals of the switching elements VPS, HS, LS.

The load path, configured between the two terminals 1, 2 of the first switching element HS, has a resistance which, as a result of the current flowing via the switching element to the load L, gives rise to a voltage drop. The voltage drop may be determined as a measure of the current flowing in the load L, and used for diagnostic purposes accordingly.

If the connection between the output terminal OUT of the circuit arrangement SA and the load L is interrupted, or reaches a very high resistance level, such that the load L can no longer be operated normally, only a very small current will flow in the first switching element HS. This very small current is customarily detected by comparison with a corresponding reference current, or by the determination of current with reference to a voltage drop on a resistance, by the comparison of this voltage with a reference voltage.

The problem arising here is that the load path resistance of the first switching element HS is relatively low, and is intended to be so, in order to restrict losses to a minimum in normal duty. However, in the event of only a very small fault current, only a correspondingly small voltage drop will be generated on the load path resistance of the first switching element HS between its terminals 1, 2.

Therefore, according to the invention, at least one further switching element S1 and, in the example of embodiment represented, a number n of switching elements from S1 to Sn are connected in parallel to the first switching element H2, whereby the respective load path terminals thereof 1, 2, 1', 2' and 1", 2" are mutually interconnected. As they are connected in parallel to a p-channel MOSFET, the further switching elements S1 to Sn are also configured as p-channel MOSFETs. Although the load path resistances thereof may all be equal, they may also be selected with different values such that, by the corresponding selection of the switching elements HS, S1 to Sn to be closed, a desired total load path resistance can be achieved.

In order to be able to actuate the corresponding switching element or the corresponding switching elements, the control terminals thereof are connected to a gate driver circuit 10 which, in turn, is connected via a control line CONTROL to a control unit 11, which also controls the gate control circuit 12. The further switching elements S1 to Sn, the gate driver circuit 10 and the control unit 11 constitute the diagnostic circuit DS according to the invention.

An analysis unit 13 is provided with two inputs E1, E2 and one output A and, in the simplest case, is configured as a comparator circuit. In the example of embodiment represented, in which the first switching element HS is a high-side switch, the first input E1 of the analysis unit 13 is connected to the high potential of the supply voltage Vsup via a reference voltage source 14 which delivers a reference voltage Uth. The second input E2 is connected to the output terminal OUT of the circuit arrangement SA such that, between the two inputs E1, E2, the differential of the voltage drop in the first switching element HS and the reference voltage Uth is applied. In this case it is assumed that the voltage drop in the third switching element VPS is negligible. The analysis unit 13 thus assumes a low state, if the voltage drop in the first switching element HS is smaller than the reference voltage Uth.

In the event that the first switching element is a low-side switch, the first input E1 should be connected to the lower potential of the supply voltage source Vsup via a correspondingly polarized reference voltage source.

Figure 2:
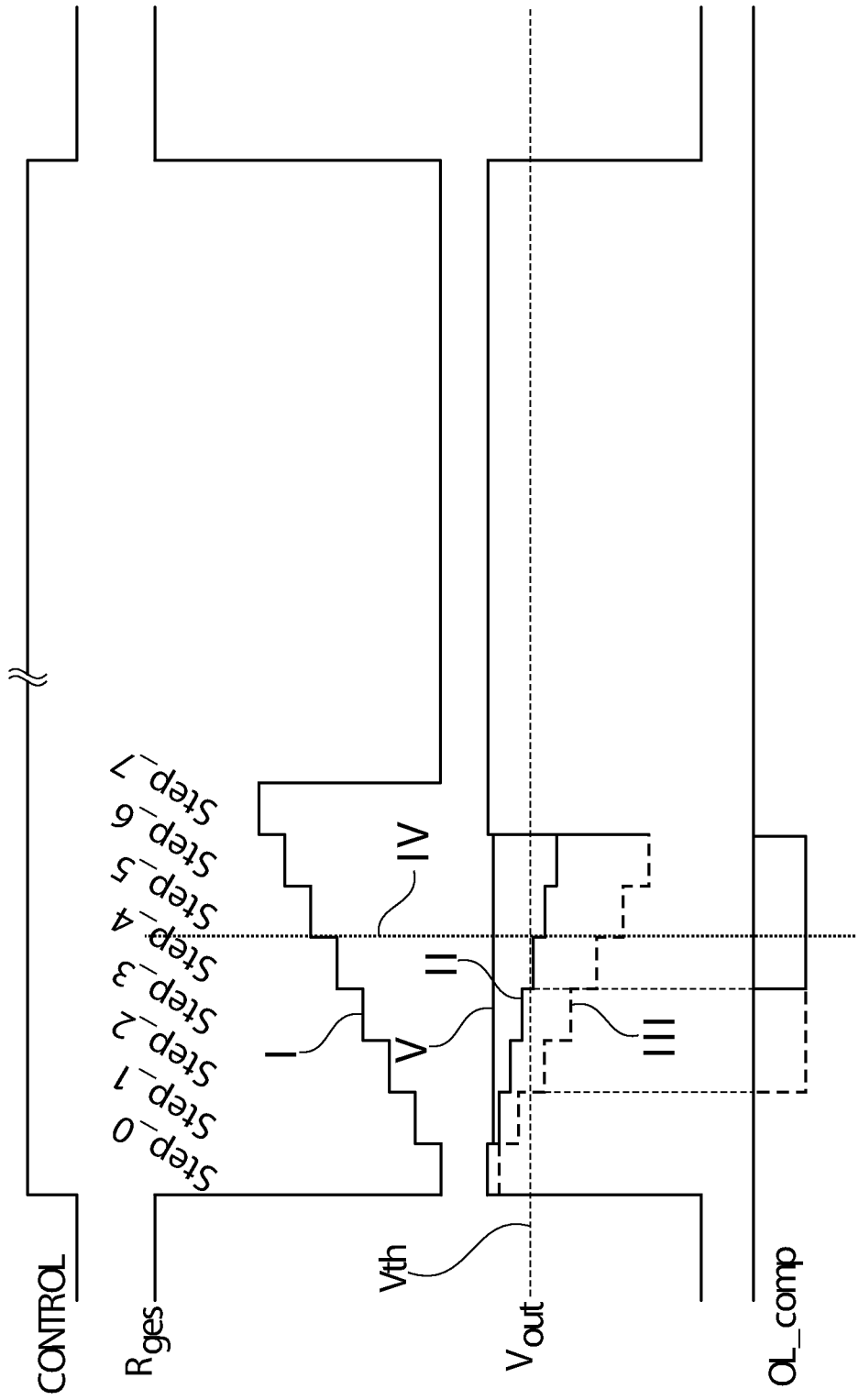
FIG. 2 is a graph showing a signal, voltage and resistance characteristic for a method according to the invention for the operation of the diagnostic circuit according to the invention.

A possible method for the operation of the diagnostic circuit DS according to the invention in FIG. 1 is represented in FIG. 2 with reference to the characteristics of the total load path resistance Rges in relation to the voltage characteristic at the output terminal OUT of the circuit arrangement SA, and to the level at the output A of the analysis unit 13.

In accordance with the sequence diagram shown in FIG. 2, the diagnosis of a line interruption is initiated at a point in time t0, whereby the control unit 11 sets the status of a connecting line to the gate driver circuit 10, designated as CONTROL, to a high state. Accordingly, in the example represented, all the further switching elements S1 to Sn are set to a conductive state, such that their load path resistances are connected in parallel to the load path resistance of the first switching element HS, resulting in a correspondingly small total load path resistance Rges. As a result of this small total load path resistance Rges, the voltage drop in the first switching element HS is small and, accordingly, the voltage at the output terminal OUT of the circuit arrangement SA is correspondingly high and exceeds the reference voltage Vth, as will be concluded from FIG. 2.

Controlled by the control unit 11 and the gate driver circuit 10, one further switching element S1 to Sn after another is now opened in succession, resulting in the stepped characteristic (step 0-step 7) indicated by I in FIG. 2, whereby the load path resistances of the further switching elements S1 to Sn are selected such that an equidistant increase in the total load path resistance Rges, as represented in FIG. 2, is generated. By the corresponding selection of load path resistances, it is naturally also possible to generate other characteristics. Specifically, combinations of further switching elements S1 to Sn can also be opened simultaneously.

The increase in the total load path resistance Rges is associated with an increase in the voltage drop on the parallel circuit of the first switching element HS and of the further closed switching elements S1 to Sn, such that the voltage $V_{out}$ at the output OUT of the circuit arrangement SA decreases correspondingly. The decrease is dependent upon the resistance value of the load L, which is represented schematically in FIG. 2 by the different characteristics, designated respectively as II and III, for the voltages $V_{OUT}$ our at the output terminal OUT of the circuit arrangement SA. Accordingly, in the case of a small load resistance, the voltage $V_{OUT}$ at the output terminal OUT drops at a correspondingly slow rate whereas, in the case of a high load resistance, it drops at a significantly higher rate.

In the example of embodiment represented, at a given point in time t1, the output voltage $V_{out}$ in the case of a high load resistance L will be lower than the reference voltage Vth, and at a given point in time t2 in the case of a small load resistance. Accordingly, at these points in time, the level OL-comp at the output A of the analysis unit 13 will switch over from a high level to a low level, thereby indicating that no line interruption is present, as a sufficiently high current has flowed in the total load path resistance.

Specific types of loads can only accommodate a specific maximum voltage drop on the first switching element HS such that, according to the invention, the control unit 11, in combination with the gate driver circuit 10, is configured, by the recording of corresponding information on the load, for example in a register, to effect the control of the further switching elements S1 to Sn, such that only a specific maximum load path resistance Rges can be set. An example of this is illustrated in FIG. 2, where this value is achieved at a point in time t3, and the diagnosis is terminated accordingly, as indicated by the line IV. In the other cases, the diagnosis is terminated at a point in time t4.

If no load is connected, the voltage Vout at the output terminal OUT changes only negligibly, as indicated in FIG. 2 with "V." the reference voltage Vth is then not undershot, so that the level OLcomp at the output A of the evaluation unit 13 does not change, whereby a power interruption is indicated.

In the example of embodiment shown in FIG. 2, the total load path resistance Rges has been adjusted successively, whereby it is assumed that eight further switching elements S1 to Sn are provided. In principle, it would be sufficient to provide one further switching element with a correspondingly high load path resistance, such that diagnosis can be executed by a simple switchover between the first switching element HS and the further switching element S1 to Sn, whereby the load path resistance of the further switching element S1 to Sn is selected with a correspondingly higher rating.

In normal service, it would also be possible for both the first switching element HS and the further switching element S1 to Sn to be closed, in order to achieve a very small total load path resistance Rges, thereby allowing losses to be restricted to a minimum in normal service, and only the first switching element HS to be opened for diagnostic purposes.

As the load path resistances of switching elements, which are configured as MOSFETs, change in response to temperature, the voltage drop on the switching elements which have been activated for diagnostic purposes will differ according to temperature and, at low temperatures, may no longer be sufficient to permit a line interruption by comparison with the reference voltage Uth. In principle, it would be possible to adjust the reference voltage Uth in accordance with the temperature. However, it is more straightforward, according to the invention, to provide further switching elements S1 to Sn, with appropriately adapted load path resistances. Depending upon the temperature, the control unit 11, in combination with the gate driver circuit 10, can execute a corresponding selection of the switching elements S1 to Sn such that, at a lower temperature, at which the load path resistance is correspondingly smaller, a further switching element S1 to Sn is selected with a higher rated resistance. Conversely, the switching elements S1 to Sn can be controlled in response to a rise in temperature.

In the same way—as shown by the characteristics II and III for the output voltages $V_{out}$ in FIG. 2—the switching elements can also be selected with load path resistances which are appropriate to the resistance rating of the connected load L, thereby ensuring that the level of the reference voltage Uth can be achieved, and permitting the more rapid achievement of the latter in the interests of expediting the diagnosis. For example, in the case of the characteristic shown in FIG. 2 for a low load resistance, three further switching elements S1 to Sn could be opened immediately, such that the total load path resistance Rges will already achieve the value for the associated time t2 upon the first actuation at t1.

A key feature of the invention is that it permits the detection of a line interruption without substantial expenditure, as would be associated with an analog control system, by the simple opening and closing of parallel-connected additional switching elements S1 to Sn to a first switching element HS, by which a load L can be connected to a supply voltage Vsup, whereby, for the duration of a diagnostic time interval. The resistance rating of the switching elements which are active during diagnosis, or of the switching element, is selected such that even a small fault current will result in a significant voltage drop on the load path resistance, which can be detected by a reference voltage Uth which can be generated without substantial expenditure.

Moreover, digital execution permits a straightforward adaptation to variations in temperature and to the nature of the load, whereby information is entered in corresponding registers of the control unit, on the basis of which corresponding sequences for the actuation of switching elements can be executed.

The invention claimed is:

1. A diagnostic circuit for detecting an interruption in a connection between a circuit configuration having at least one first controllable switching element, forming a load path between a first and a second load terminal, and a load connected to the first controllable switching element, said load being connected by the first controllable switching element to a supply voltage source with a first terminal for a high supply potential and a second terminal for a lower supply potential, the diagnostic circuit comprising:

at least one further controllable switching element forming a further load path between a first load terminal and a second load terminal of said further controllable switching element, the further load path connected in parallel to the load path of the first controllable switching element;

a control unit for controlling control inputs of the first controllable switching element and of said at least one further controllable switching element, whereby said control unit is configured for controlling the first controllable switching element and said at least one further switching element in accordance with a time-adjustable operating sequence;

a reference voltage source outputting a reference voltage; and an analysis unit having a first input, a second input and an output, whereby said first input is connected, via said reference voltage source, to the first terminal of the supply voltage source to which the first controllable switching element is connected, and said second input is connected to said load terminals of the first controllable switching element and of said at least one further switching elements which are connected to the load, whereby said analysis unit is configured to indicate, at said output, whether a voltage in the load path of the first controllable switching element and/or the further load path of said at least one further controllable switching element is higher or lower than the reference voltage.

2. The diagnostic circuit according to claim 1, wherein said the first controllable switching element and said at least one further controllable switching element have different load path resistances.

3. The diagnostic circuit according to claim 1, wherein said control unit is configured to dictate a control of at least one of the first controllable switching element or of said at least one further controllable switching element and a sequence of control operations according to a temperature of the first controllable switching element and said at least one further controllable switching element.

4. The diagnostic circuit according to claim 1, wherein said control unit is configured to dictate a control of at least one of the first controllable switching element or of said at least one further controllable switching element and a sequence of control operations according to at least one of a nature or magnitude of the load to be connected.

5. The diagnostic circuit according to claim 4, wherein said control unit is provided with a register, accessible via an interface, in which information of a type of control to be executed on the first controllable switching element and on said at least one further controllable switching element and a sequence of control operations, can be stored.

6. A method for operating a diagnostic circuit according to claim 1, which comprises the step of:

controlling the first controllable switching element and the at least one further controllable switching element in a switching sequence, either individually or in combinations, such that a desired total load path resistance or total load path resistance time characteristic is achieved.

7. The method according to claim 6, which further comprises controlling the first controllable switching element and the at least one further controllable switching element firstly to close and thereafter, in a predetermined sequence, individual switching elements or combinations of switching elements are then controlled to open in succession.

8. The method according to claim 6, which further comprises controlling the first controllable switching element and the at least one further controllable switching element such that, in accordance with a connected load, only a maximum permissible load path resistance is achieved.

* * * * *